United States Patent [19]

Weidner et al.

[11] 4,076,352
[45] Feb. 28, 1978

[54] SLIDING DRAWER

[75] Inventors: Hans Jürgen Weidner, Nuremberg; Willi Jüttner, Altenfurt, both of Germany

[73] Assignee: U.S. Philips Corporation, New York, N.Y.

[21] Appl. No.: 697,566

[22] Filed: Jun. 18, 1976

[30] Foreign Application Priority Data

Jun. 18, 1975 Germany .............................. 2527176

[51] Int. Cl.² ............................................. G09F 19/00
[52] U.S. Cl. ................................................. 312/330 R
[58] Field of Search ............... 312/294, 320, 319, 330, 312/333, 348, 214; 40/65, 104

[56] References Cited

U.S. PATENT DOCUMENTS

| | | | |
|---|---|---|---|
| 1,465,244 | 8/1923 | Hager | 312/330 |
| 1,845,470 | 2/1932 | Wood | 312/330 |
| 2,852,882 | 9/1958 | David | 312/330 |
| 3,423,862 | 1/1969 | Koller | 312/330 |

Primary Examiner—Casmir A. Nunberg
Attorney, Agent, or Firm—Frank R. Trifari; David R. Treacy

[57] ABSTRACT

A sliding drawer for storage of instructions in electronics racks or the like. A bottom portion of the drawer is constructed as a flexible tongue which can be locked in the front wall to hold instructions in place. A grip on the flexible tongue is used as a drawer pull and for unlocking the tongue.

4 Claims, 4 Drawing Figures

SLIDING DRAWER

BACKGROUND OF THE INVENTION

The invention relates to a sliding drawer, comprising a bottom plate on which two side walls, a rear wall and a front wall are provided.

For example, in the telecommunications field work instructions such as, for example, adjusting and operating instructions are often required not only for putting a new installation into operation, but also for process control during the entire service life. In order to save time and to avoid mistakes when there are many different adjusting and operating instructions, the adjusting and operating instructions relating to different parts of the racks are preferably not stored centrally; it would be better to have these instructions available at the relevant parts of the racks at all times. To this end, a special sliding drawer is preferably provided in the relevant racks.

SUMMARY OF THE INVENTION

An object of the invention is to provide a sliding drawer for the storage of adjusting and operating instructions which is simple and cheap to manufacture.

Another object is to provide a drawer in which instructions may be stored in a readily accessible manner without risk of loss.

A further object of the invention is to allow simple insertion of the sliding drawer into and removal from the racks.

According to the invention, a portion of the bottom plate of the drawer, which adjoins the front wall, is provided with slots which extend parallel to the side walls in order to obtain a flexible tongue which may be locked in the front wall in the closed condition of the sliding drawer and which is provided with a grip.

BRIEF DESCRIPTION OF THE DRAWINGS

The invention will be described in detail hereinafter with reference to the drawing, in which.

DESCRIPTION OF THE PREFERRED EMBODIMENTS

Figure 1:
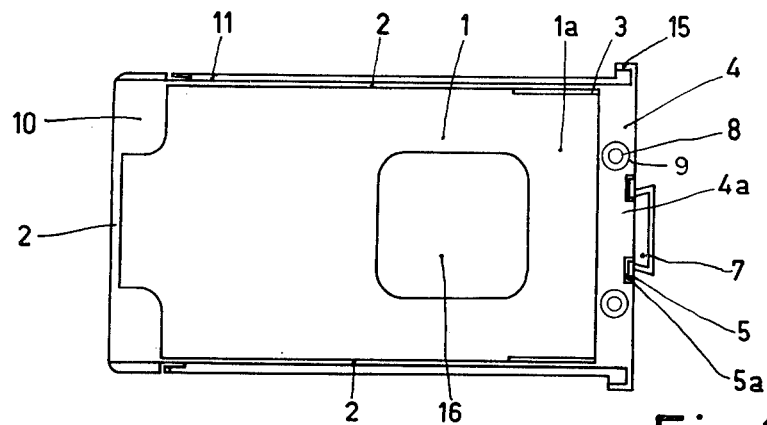
FIG. 1 is a plan view of a sliding drawer according to the invention.
Figure 2:
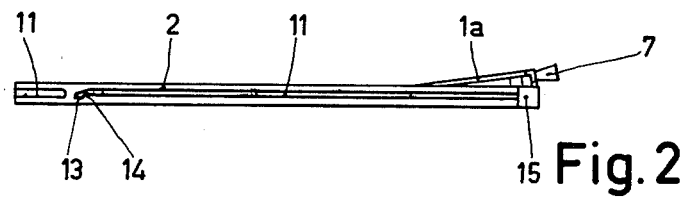
FIG. 2 is a side view, turned upside down, of the drawer of FIG. 1, with the tongue in unlocked position to receive a document.
Figure 4:
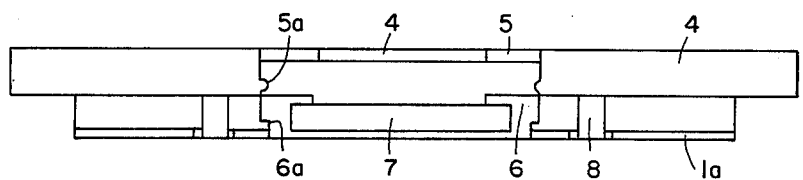
FIG. 4 is a front view, turned normally, of a drawer in the unlocked condition of FIG. 2.

The sliding drawer shown in FIG. 1 comprises a bottom plate 1 provided with upright side walls 2 at both long sides and a rear wall 2 at the rear. A front wall 4 is provided at the front. The front portion of the bottom plate 1 which adjoins the front wall 4 is provided with slots 3 which extend parallel to the side walls 2 and which have a length approximately equal to one third of the length of the bottom plate 1. This portion of the bottom plate 1 forms a flexible tongue 1a. The front wall 4 is also provided with a clamping strip 4a extending rearward from the top edge of the wall 4, as shown in FIG. 1, and overlying the tongue 1a so as to define a space between the strip and the tongue. The front wall 4 furthermore comprises two recesses 5 which are situated symmetrically with respect to the center, outer side walls of the recesses extending downward to portions 5a of the front wall 4 which project into the recesses, as best shown in FIG. 4. The flexible tongue 1a of the bottom plate 1 has two strips 6 (see FIG. 4) extending upward and situated exactly opposite the recesses 5. A grip 7 is also provided on the tongue 1a extending forward from a position between the strips 6.

When the grip 7 is pulled upwards from the position shown in FIG. 4 to permit sliding the drawer into a rack, the strips 6 slide over the projecting portions 5a and into the recesses 5 in the front wall 4. Each of the projecting portions 5a then engages a recess 6a in the strips 6. In the locked condition of the sliding drawer, adjusting and operating instructions stored in the drawer are clamped and retained between the clamping strip 4a and the end of the bottom plate 1 near the front wall 4.

When the drawer is pulled out and subsequently grip 7, the projecting portions 5a are disengaged from the recesses 6a and the strips 6 slide past the projecting portions 5a so that the front end of the tongue 1a is moved down away from the clamping strip 4a via the projecting portions 5a.

In a further embodiment of the sliding drawer in accordance with the invention, the retention of the instructions stored in the sliding drawer is substantially improved in that two retaining pins 8 are provided on the flexible tongue 1a projecting upward under the clamping strip 4a. The height of the retaining pins 8 is such that they project into corresponding bores 9 in the clamping strip 4a in the locked condition of the sliding drawer. The holding pins 8 are chamfered in the insertion direction of the instructions, so that the instructions to be stored can readily slide over the retaining pins 8 and the pins can then be pushed through corresponding holes in the documents.

Horizontal plates 10 are provided in the corners formed by the rear wall and the side walls 2, at the level of the tops of these walls as shown in FIG. 1. The instructions are additionally retained by sliding the instructions underneath these plates 10. The instructions are at the same time prevented from projecting outside the side walls 2, so they will not be damaged when the drawer is slid into a rack.

The outer side of the two side walls 2 is provided with a guide strip 11. When the drawer is inserted, these guide strips 11 slide into U-shaped guide troughs provided in the rack for this purpose. The guide troughs as well as the rack, being of a commonly used type, are not shown for the sake of clarity.

The guide strips 11 are interrupted near the rear-most portion of the side walls 2. The end of the longer portion of each of the guide strips 11 is separated from the wall 2 by a slot 18 and act as a retaining spring 14 due to the bending of the separated portion of the guide strip 11 and the reduction of the cross-section thereof, and also due to the provision of a locking cam 13. The locking springs 14 cooperate with locking means (not shown) in the rack and make it impossible for the sliding drawer to drop out of the rack when it is pulled out.

The front wall 4 of the sliding drawer also comprises overhanging side portions 15. These overhanging portions 15 serve as abutments, to ensure that the front wall 4 of the sliding drawer, also serving as a front plate, is properly flush with the front plates of other modules or sliding drawers in a rack.

Figure 3:
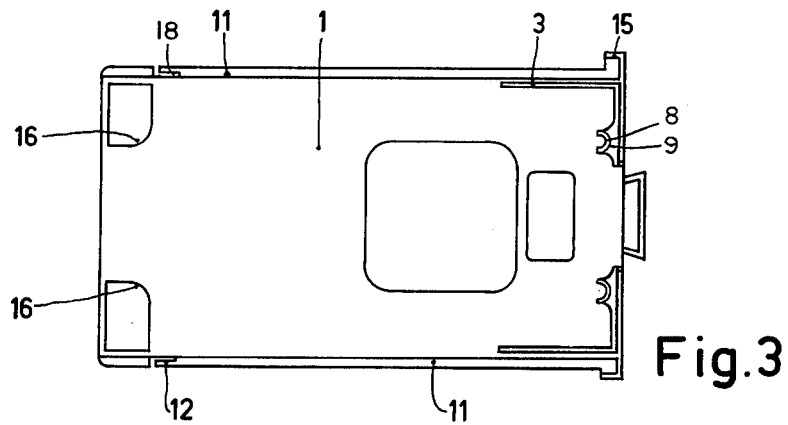
FIG. 3 is a bottom view of the embodiment of FIG. 1.

In order to facilitate the storage of the instructions underneath the plates 10 as well as the removal of the stored instructions from the sliding drawer, the bottom plate 1 is provided with openings 16 underneath the plates 10 (see FIG. 3) as well as approximately in its center.

The sliding drawer in accordance with the invention can be particularly simply and cheaply manufactured in a single operation by molding as an integral unit of a synthetic material.

What is claimed is:

1. A sliding drawer, comprising a bottom plate, two side walls and a rear wall connected to the bottom plate, and a front wall connected to the side walls, wherein a portion of the bottom plate which adjoins the front wall is separated from the side walls by slots which extend parallel to the side walls to form a flexible tongue, and the drawer comprises means for locking the tongue in said front wall in a locked condition of the sliding drawer, in an unlocked condition of the drawer the tongue being bent downward from the position of the tongue when locked.

2. A sliding drawer as claimed in claim 1, wherein the tongue has a free end with a retaining pin projecting upward, said front wall comprises a retaining strip projecting rearward and having a bore, said pin being arranged to engage said bore when said drawer is in the locked condition, and adapted for retaining a document placed in the drawer by engaging a corresponding hole in the document.

3. A sliding drawer, comprising a bottom plate, two side walls and a rear wall connected to the bottom plate, and a front wall connected to the side walls, wherein a portion of the bottom plate which adjoins the front wall is separated from the side walls by slots which extend parallel to the side walls to form a flexible tongue, and the drawer comprises means for locking the tongue in said front wall in a locked condition of the sliding drawer, said means comprising a recess in said front wall and a strip connected to said tongue arranged to enter said recess when the drawer is in the locked condition.

4. A sliding drawer as claimed in claim 3, comprising means for pulling the drawer and moving the tongue with respect to the front wall, said means for pulling and moving consisting of a grip extending forwardly from said strip.

* * * * *

UNITED STATES PATENT AND TRADEMARK OFFICE
CERTIFICATE OF CORRECTION

PATENT NO. : 4,076,352
DATED : February 28, 1978
INVENTOR(S) : HANS JURGEN WEIDNER ET AL It is certified that error appears in the above-identified patent and that said Letters Patent are hereby corrected as shown below:

Col. 2, line 19, after "subsequently" insert --a force in the downwards directions is exerted on the-- line 23, delete "via" the" and insert --.-- (period)

line 24, delete "projecting portions 5a"

*Signed and Sealed this*

*Fourth* Day of *July 1978*

[SEAL]

Attest:

RUTH C. MASON
*Attesting Officer*

DONALD W. BANNER
*Commissioner of Patents and Trademarks*